July 20, 1971 G. COMPARE 3,594,168

METHOD FOR FABRICATING PHOTOGRAPHIC ARTWORK FOR PRINTED CIRCUITS

Filed Feb. 12, 1968 2 Sheets-Sheet 1

INVENTOR.

Giampiero COMPARE

By George V. Eltgroth and Joseph B. Forman Attys

July 20, 1971 G. COMPARE 3,594,168

METHOD FOR FABRICATING PHOTOGRAPHIC ARTWORK FOR PRINTED CIRCUITS

Filed Feb. 12, 1968 2 Sheets-Sheet 2

INVENTOR.

Giampiero COMPARE

By George V. Eltgroth and Joseph B. Forman Attys 3,594,168

METHOD FOR FABRICATING PHOTOGRAPHIC ARTWORK FOR PRINTED CIRCUITS

Giampiero Compare, Milan, Italy, assignor to General Electric Information Systems S.p.A., Caluso, Turin, Italy Filed Feb. 12, 1968, Ser. No. 704,658
Claims priority, application Italy, Feb. 13, 1967, 12,554/67
Int. Cl. G03c 5/04
U.S. Cl. 96—27 8 Claims

ABSTRACT OF THE DISCLOSURE

This invention relates to a method for fabricating photographic artwork for use in the manufacture of printed circuits, the artwork being obtained through the use of a first mask of high precision pattern close to a photosensitive plate and a second mask for opaquing selected portions of the pattern of said first mask and exposing the same to appropriate radiation. This process is repeated until the desired artwork is obtained.

The present invention relates to a method for obtaining high precision photographic artwork utilized in the manufacture of printed circuits.

The term "printed circuit" is used to designate plane boards of insulating material which carry conductive strips on their surfaces, so arranged that modular circuit assemblies are obtained by applying and soldering suitable electronics components to them in proper positions. A known process for preparing such printed circuits includes applying a thin metallic foil to the surface of such boards bonded to the board by a suitable adhesive, and thereafter removing predetermined portions of the foil by photoengraving methods, thus leaving the desired conductive strips on the board. This method makes use of a photographic plate, usually called "photographic artwork," which faithfully reproduces the image of the pattern of conductive strips to be obtained at the desired final dimensions.

Through use of known methods, such photographic artwork is obtained by photographic reduction of a model drawn on a large scale, in order to obtain the desired dimensions in the final artwork. In the first place, this method calls for a large accurately drawn model of the circuit to be printed, a different model being necessary for each circuit, and, in the second place, it calls for the accurate handling of very expensive photographic apparatus to ensure the proper scale reduction without causing distortion of the reduced image.

The object of the present invention is to provide a simple and inexpensive method of obtaining very precise photographic artwork without using large scale models and without employing photographic apparatus for reducing the scale.

The method, according to my invention, is particularly suitable for producing the photographic artwork required for printed circuits designed for use in the integrated circuit packages. These packages are usually provided with a large number of connecting leads, which are to be soldered to conductive circular pads, or "lands," usually provided with a central hole through which the conducting leads pass and are connected in the desired fashion by conductive strips which are preferably parallel or perpendicular to a given direction.

The position of the "lands" must be determined with high accuracy, as generally the insulating board carries printed circuits on both its faces, and the corresponding lands on opposite faces must precisely coincide. Such precision requirements are even more exacting in the case of assemblies comprising a number of superimposed printed circuits as are used in the technique known as "multilayer printed circuits.

According to my invention, the photographic artwork is obtained by sequential separate exposure to a proper radiation source of a photographic plate in contact with high precision partial master masks, generally common to a plurality of printed designs and by the use of auxiliary masking means of lower precision, specific to each design of printed circuit, the sequential exposures being following by a single devedopment operation.

These and other features and advantages of the invention will appear more clearly from the following detailed description of an illustrative embodiment thereof, with reference to the accompanying drawings, wherein.

Figure 1:
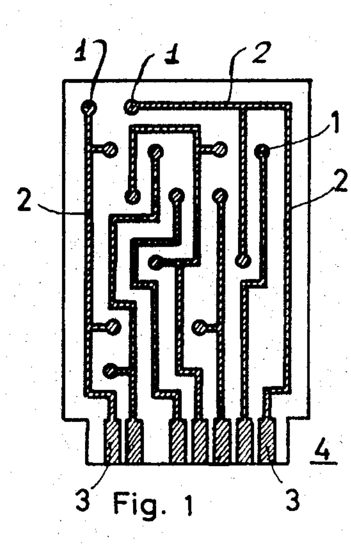
FIG. 1 shows a typical printed circuit for integrated circuit packages.

With reference to FIG. 1, which shows one side of a typical printed circuit board for packages containing integrated circuits, it may be seen that the conductive elements of the printed circuit may be designated by "lands" that is, circular conductive areas, such as indicated by reference numeral 1, which are usually perforated at the center, to permit the connecting lead of the package to be soldered thereto; in "wiring conductors," such as indicated by reference numeral 2, having a rectilinear, elongated shape, oriented in either one of two mutually perpendicular directions, and in "connecting pads" such as indicated by reference numeral 3, forming the "connector" 4, for connecting the board to the external wiring.

The lands occupy positions which are arranged along equally spaced rows and columns of a matrix pattern.

Generally each board carries a printed circuit on each side, and a land on one side has a corresponding land on the opposite side in the same position, thus great precision in the positioning of these lands is required, as the center hole must be perfectly centered in both lands of each pair. This requirement is much more stringent for multilayer printed circuits.

Figure 2:
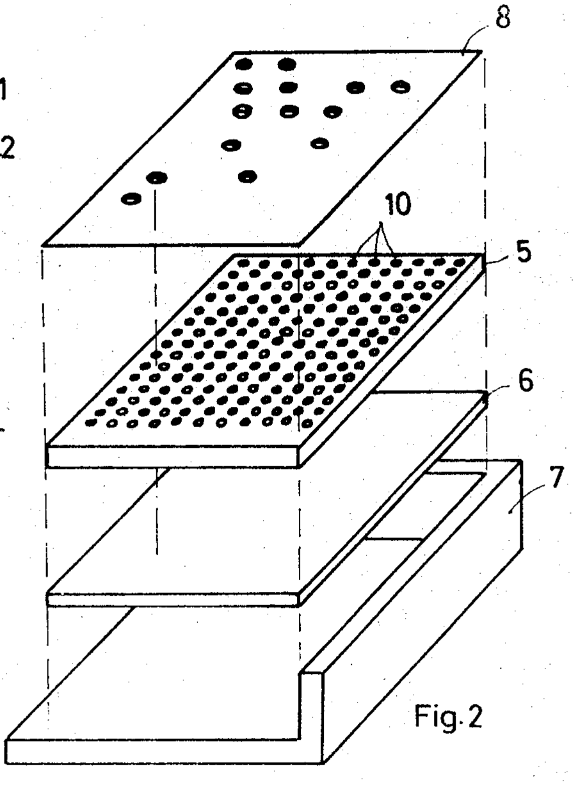
FIG. 2 shows a perspective view of the cooperating masking means and the photographic plate in the first phase of the method of invention.
Figure 4:
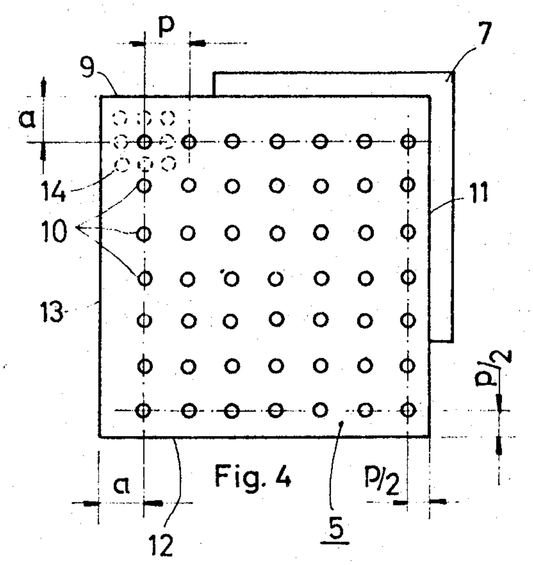
FIG. 4 shows a perforate plate and the related reference means.

The degree of precision required for the position of the lands is therefor greater than the one required for the other elements. To attain such precision, a perforated plate, see FIGS. 2 and 4, is prepared, using a highly non-deformable material, having a low thermal expansion coefficient, as, for instance Invar steel, which has a thermal expansion coefficient of approximately $1.5\times10^{-6}/^{\circ}$ C. This plate, having ground surfaces, and a thickness suitable to ensure the desired rigidity and non-deformability, is preferably square, and is perforated along equally spaced rows and columns parallel to the sides, by holes 10 of a diameter equal to the diameter of the lands. The distance $p$ between rows and between columns may be equal to the distance between the rows and the columns of the matrix pattern in accordance with the manner in which the lands are arranged, or it may be equal to a multiple of the same, for example twice as large. A convenient value for the diameter of the holes may be, for example, 1.2 mm., or ½ inch, and the distance between rows and columns, or pitch $p$, may be, for example, 1 inch (2.54 mm.). If the plate is perforated by means of a high precision boring machine, very small tolerance in the positioning of the holes may be attained, for example a maximum error of ±5 microns.

This perforated plate is used as a master mask for the land pattern. It is intended that any suitable metallic or non-metallic material may be used for its manufacture and that a photographic plate, having a matrix pattern of transparent circular areas may be used in its stead.

As shown in FIG. 2, the perforated plate 5 is superposed, in a dark room, to the photographic plate 6 which, at the conclusion of all steps, will result in the photographic artwork for the desired printed circuit.

By suitable reference means, such as the reference square 7, the relative positions of the perforated plate 6 and of the photographic plate 5 are very precisely determined.

To avoid the appearance of unwanted land images on the final artwork the holes in the perforated plate which do not correspond to the position of desired lands must be made opaque to the light. This result is obtained through the use of auxiliary masking means, for example, a plate 8 of opaque material provided with openings or transparent areas corresponding to the desired holes which is placed on the perforated plate and results in the desired land images on the final artwork. It is obvious that the precision required for such auxiliary masking means is rather low, as it is sufficient that the transparent areas on the auxiliary masking means encompass all the holes on the steel plate corresponding to the wanted lands, without interfering with any other hole.

Figure 3:
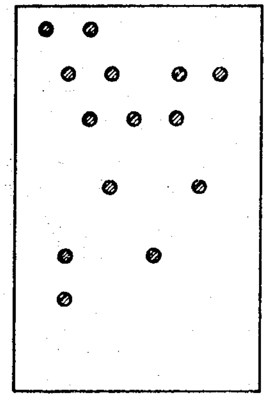
FIG. 3 shows a drawing used to obtain one of the auxiliary masking means, and also the latent image to tained after the first phase of operation.

A convenient method of obtaining the auxiliary masking means is, for example, to draw by hand, on a transparent sheet, the opaque areas corresponding to the wanted lands as shown in FIG. 3. By contact exposure and development of a photographic plate, a negative image is obtained, on which these areas will be transparent.

The auxiliary masking means 8 thus obtained is superimposed on the perforated plate and the photographic plate, and the assembly is exposed to a suitable radiation source. As a result, a latent image is generated in the photographic plate, as shown in FIG. 3, this latent image comprising precisely and exclusively the latent images of the wanted lands.

It may be noted that to obtain different latent land images corresponding to different printed circuit designs it is sufficient to change the auxiliary masking means 8. A variety of different photographic artwork therefor may be obtained by means of a single perforated plate 5, all the position of the land images on such different artwork being determined with the same high precision, equal to the precision of the perforations on the steel plate 5.

The pitch $p$, that is, the space between center lines of rows and columns of the land matrix may be reduced, for instance halved, with respect to the pitch between rows and columns of the holes of the perforated plate. This may be accomplished if the perforated plate has a square shape, as indicated in FIG. 4, by making the distance $a$ between the center line of the upper row and the side 9 of the plate equal to the pitch $p$, and also making the distance between the leftmost column and a second side 13 equal to $p$, whereby the distance between the lower row and the side 12 of the plate is made equal to $p/2$ and the distance between the rightmost column and the side 11 is made equal to $p/2$.

Through use of the foregoing structure and consecutive exposures of the photographic plate through the masking means, such that after each exposure the plate is rotated through 90° in its plane and its upper and right sides are placed in contact with the reference square 7, latent images of the holes which are arranged as elements of a matrix of rows and columns distanced by a pitch equal to $p/2$, as is shown by the dashed circles 14 in FIG. 4, are obtained.

During the four consecutive exposures, the auxiliary masking means having the transparent areas arranged along rows and columns of a matrix of pitch $p/2$, is maintained in a fixed position, thus allowing only the areas corresponding to the desired land images to be exposed. By this method, very small values of the distance between rows and columns of the land matrix may be attained, whereas the distance of the perforated plate matrix holes may have a conveniently higher value.

After the latent images of the desired lands are obtained, the photographic plate is not developed, but the operations for obtaining the latent images of the wiring conductors and of the connection pads are carried on as hereafter explained.

In general, the precision required for the latter elements is less than the one required for the lands, therefore the master masks may be obtained by less expensive means.

An apparatus called a "Coordinatograph" which is known, allows one to draw straight lines on a plane surface along two mutually perpendicular directions, at predetermined spacing, with high precision.

Transparent plastic sheets having a surface covered by a very thin opaque layer, which can be "stripped off" along lines cut on the surface, so that the regions from which the opaque layer is removed become transparent is also known. These sheets are generally known as "cut-and-strip" sheets.

Figure 5:
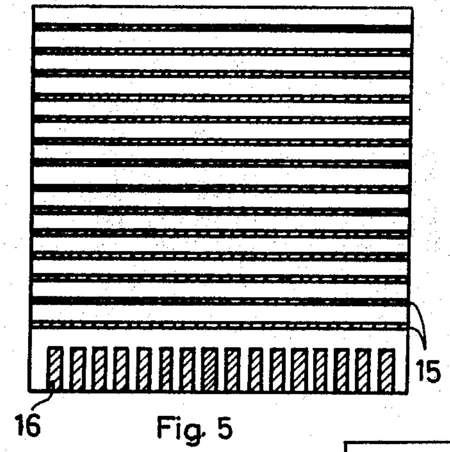
FIG. 5 shows a partially transparent sheet used to obtain the master masks in the following phases of the process.

According to my invention, the opaque layer of a sheet, as described, is cut along parallel lines through the use of a Coordinatograph, and the opaque layer is stripped off between pairs of adjacent lines to obtain a set of opaque parallel strips 15 (FIG. 5) having a width equal to the width of the desired wiring conductors. The space between these opaque strips is transparent. Through use of the same process it is also possible to obtain, in proper position, on the same plastic "cut-and-strip" sheet, the pattern of all possible connecting pads forming the connector, each connecting pad being represented by an opaque region 16 having the same dimensions and the same location, in respect to the stripes, as the real pad.

Through this means, tolerances of ±0.02 mm. in the position and dimensions of the stripes and of the pads may be readily obtained. Such tolerances are generally sufficient in most cases.

The plastic sheet, thus prepared, is used by contact exposure and development, to obtain one or more photographic plates having the same pattern as a negative, whereby the stripes corresponding to the wiring conductors and the regions corresponding to the connecting pads are transparent, and the remainder of the plate is opaque. The precision of such pattern is substantially the same as that of the pattern obtained on the plastic sheet through the use of the Coordinatograph. These photographic plates are used as master masks to obtain the latent images of the wiring conductors and of the connecting pads.

A method for using these plates is to render opaque, by hand applying a proper opaque paint, transparent strips, or portions of the same, which are not to result in a latent image of wiring conductors or connecting pads. The same effect may be more conveniently obtained through the use of auxiliary masking means, for example an auxiliary photographic plate. This auxiliary plate is obtained, for example, by preparing a hand-made drawing on which the desired portions of wiring conductors, parallel in a predetermined direction, and the desired connecting pads result in opaque regions. This hand-made drawing is used to obtain, by contact exposure and development of a photographic plate, an auxiliary masking means on which the desired portions of the wiring conductors in the particular direction, and the wanted connecting pads, appear as transparent regions. It is obvious that the precision required for such a drawing is rather low, as it is sufficient that the transparent regions in the auxiliary plate encompass the portion of the transparent stripes on the master mask, which would result in latent images of the wiring conductors without interfering with other transparent regions. The same may be said for the contact pads.

Figure 7:
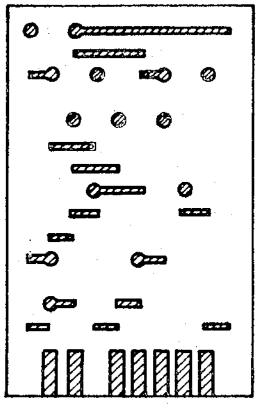
FIG. 7 shows the latent image in an intermediate phase.
Figure 6:
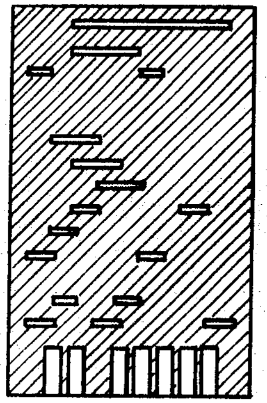
FIGS. 6 and 8 show masks used in different phases of the process.

An assembly of the master mask and the auxiliary masking means is thus obtained, whereby only the portions of stripes which should result in real wiring conductors are transparent. By the same process, only the connecting pads which should be effectively present on the final artwork, appear as transparent regions. The mask assembly so obtained is shown in FIG. 6. It is superposed, in the dark room, and using suitable reference means, to the photographic plate 6 on which the latent images of the lands are already present. By exposing the mask assembly and the photographic plate to a suitable radiation source, another latent image comprising the wiring conductors, parallel in a preselected direction, and the connecting pads, is added to the previous latent image of the land pattern, as shown in FIG. 7.

Figure 8:
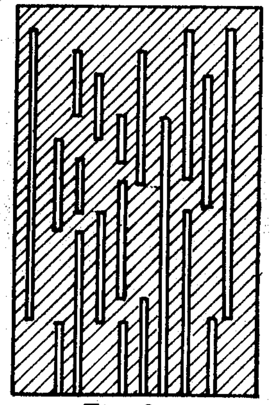
Figure 9:
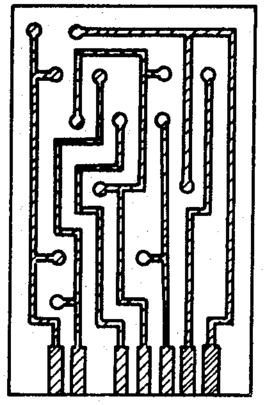
FIG. 9 shows the developed final image of the complete photographic artwork.

Using the same process, a master mask carrying the transparent pattern of stripes having a direction perpendicular to the previously referred to perpendicular stripes and having predetermined portions of these stripes made opaque by hand application of suitable opaquing or, the assembly of a master mask and of suitable auxiliary masking means, whereby only the portions of the stripes corresponding to the desired wiring conductors in a direction perpendicular to the previous one, appear as transparent regions, as shown in FIG. 8, is superposed in the dark room to the same photographic plate, and a third exposure to a suitable source of radiation is carried on, thus completing the latent image of the desired printed circuit. Thereafter, the photographic plate is developed, to obtain the complete final artwork, as shown in FIG. 9.

In another embodiment of the present invention, the stripes corresponding to the wiring conductors may be obtained using, as a master mask, a solid metallic plate provided with elongated parallel slits obtained by means of precision machining. These slits 17 may be as long as the total length of the wiring conductors, as indicated in FIG. 10, or, if necessary, in order to maintain the rigidity and non-deformability of plate, these parallel slits, as is shown in FIG. 11, may be of reduced length, and so disposed as to be able to produce by consecutive photographic exposures and corresponding longitudinal displacement of the plate, the latent images of continuous stripes, and in cooperation with an auxiliary masking means, to produce the latent images of the desired wiring conductors.

Figure 10:
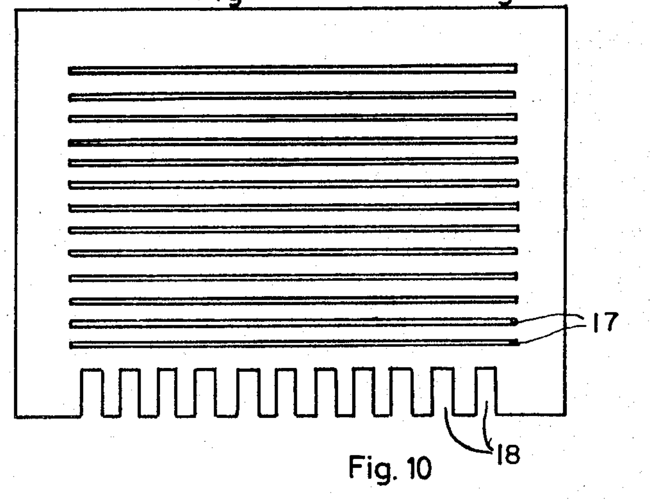
FIG. 10 shows a plate used in a variant of the method.
Figure 11:
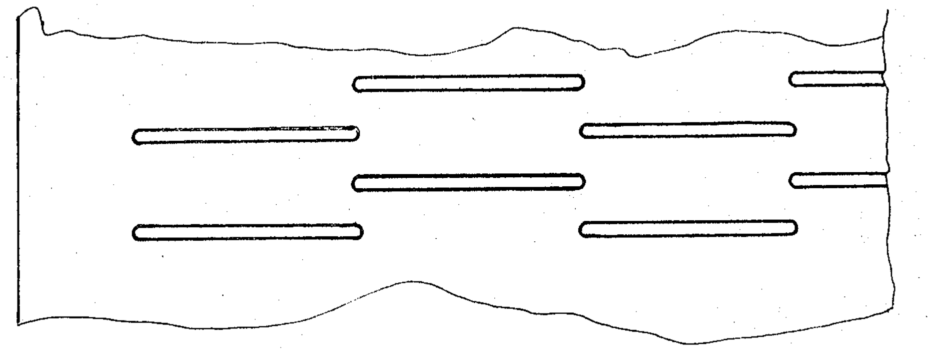
FIG. 11 shows another plate used in another variant of the proposed method.

In FIG. 10 the plate with elongated slits 17 is also shown to include a number of slots 18 having the dimensions and the positions of the connecting pads.

Many variations and modifications of the indicated method, comprising a different succession of operations, the use of differently constructed and operated mask means, and the regrouping or separating into different steps of the consecutive exposures, may be thought of without departing from the spirit and scope of the invention.

What is claimed is:

1. A method for providing the image of one of a plurality of different circuits on a photosensitive member, comprising successively exposing said photosensitive member to a radiation source through a plurality of different mask assemblies, wherein each of said mask assemblies comprises a master mask and an auxiliary mask, each of said master masks having the configuration of a respective different plurality of all of the circuit elements in all of said circuits, and each of said auxiliary masks having a configuration for rendering ineffective selected ones of the element configurations of the corresponding master mask.

2. The method of claim 1, wherein each of said configurations of different pluralities of circuit elements comprises a plurality of respective identical geometrical patterns.

3. A method for providing the image of one of a plurality of different circuits on a photosensitive member, wherein each of said circuits comprises a plurality of regularly disposed connection areas coupled together by a plurality of regularly disposed conductors and wherein each of said different circuits comprises different ones of said connection areas and conductors, comprising the steps of:

exposing said photosensitive member to a radiation source through a first mask assembly comprising a relatively high precision first master mask provided with the configuration of each different connection area in all of said different circuits and a relatively low precision first auxiliary mask for rendering ineffective selected ones of said connection area configurations; and exposing said photosensitive member to a radiation source through at least one second mask assembly comprising a second master mask provided with the configuration of each different conductor of a plurality of said conductors in all of said different circuits and a second auxiliary mask for rendering ineffective selected ones of said conductor configurations.

4. The method of claim 3, wherein said step of exposing said photosensitive member to a radiation source through said first mask assembly comprises a succession of exposures of said photosensitive member through said mask and wherein in each of said exposures said first mask assembly is oriented differently relative to said photosensitive member.

5. The method of claim 4, wherein in said succession of exposures said first mask assembly is successively rotated.

6. The method of claim 3, wherein one of said steps of exposing said photosensitive member to a radiation source through one of said mask assemblies comprises a succession of exposures of said photosensitive member through said mask and wherein in each of said exposures the corresponding one of said master masks is oriented differently relative to the corresponding one of said auxiliary masks.

7. The method of claim 3, wherein said conductors are parallel and rectilinear.

8. The method of claim 3, wherein said plurality of conductors comprises first and second sets of parallel and rectilinear conductors, the conductors of said one set being oriented transversely to the conductors of said other set, and wherein said step of exposing said photosensitive member to a radiation source through at least one second mask assembly comprises first exposing said photosensitive member to a radiation source through a mask assembly having a master mask provided with the configuration of said first conductor set and then exposing said photosensitive member to a radiation source through a mask assembly having a master mask provided with the configuration of said second conductor set.

References Cited

UNITED STATES PATENTS

| | | | |
|---|---|---|---|
| 3,264,105 | 8/1966 | Houtz | 96—36.2 |
| 3,288,607 | 11/1966 | Middleton | 96—27 |
| 3,385,702 | 5/1968 | Koehler | 96—44X |

OTHER REFERENCES

Rudge, "Making Photographic Masks and Artwork," IBM Tech Discl. Bulletin, vol. 6, No. 7, Dec. 7, 1963, pp. 92–94.

GEORGE F. LESMES, Primary Examiner

R. E. MARTIN, Assistant Examiner

U.S. Cl. X.R.

96—36.2, 38.4, 44